US010340167B2

(12) United States Patent
Yoo et al.

(10) Patent No.: US 10,340,167 B2
(45) Date of Patent: Jul. 2, 2019

(54) ROBOT FOR TRANSFERRING ARTICLE

(71) Applicant: DAIFUKU CO., LTD., Osaka (JP)

(72) Inventors: Dong-Gyu Yoo, Cheonan-si (KR);
Jae-Yoon Kim, Cheonan-si (KR)

(73) Assignee: DAIFUKU CO., LTD., Osaka-Shi, Osaka (JP)

( * ) Notice: Subject to any disclaimer, the term of this patent is extended or adjusted under 35 U.S.C. 154(b) by 698 days.

(21) Appl. No.: 15/071,456

(22) Filed: Mar. 16, 2016

(65) Prior Publication Data

US 2016/0272423 A1 Sep. 22, 2016

(30) Foreign Application Priority Data

Mar. 16, 2015 (KR) .................. 10-2015-0036084

(51) Int. Cl.
*H01L 21/677* (2006.01)
*B65G 1/04* (2006.01)

(52) U.S. Cl.
CPC .... *H01L 21/67733* (2013.01); *H01L 21/6773* (2013.01); *H01L 21/67736* (2013.01); *H01L 21/67769* (2013.01); *B65G 1/0457* (2013.01)

(58) Field of Classification Search
CPC ......... H01L 21/67733; H01L 21/67769; H01L 21/67736; H01L 21/6773; B65G 1/0457
See application file for complete search history.

(56) References Cited

U.S. PATENT DOCUMENTS

| 7,686,176 B2 | 3/2010 | Murata |
| 9,022,714 B2 * | 5/2015 | Lee ................... H01L 21/67173 414/217 |
| 9,048,275 B2 | 6/2015 | Murata et al. |

FOREIGN PATENT DOCUMENTS

| CN | 102470982 A | 5/2012 |
| JP | 3716962 B2 | 11/2005 |
| KR | 1020080069295 A | 7/2008 |
| KR | 20080082928 A | 9/2008 |
| KR | 20140087293 A * | 7/2014 |
| KR | 20140087293 A | 7/2014 |

OTHER PUBLICATIONS

Taiwanese Office Action issued in corresponding Taiwanese Patent Application No. 105107967 dated Jul. 24, 2017.
Chinese Office Action issued in corresponding Chinese Patent Application No. 201610149801.3 dated Feb. 11, 2018.
Korean Office Action Corresponding to 10-2015-0036084 dated Mar. 2, 2016.

* cited by examiner

*Primary Examiner* — Michael S Lowe
(74) *Attorney, Agent, or Firm* — Davis & Bujold PLLC; Michael J. Bujold

(57) ABSTRACT

Disclosed herein is a robot for transferring an article: a body configured to be moved while hanging on a moving rail; a holding unit configured to hold the article; a two-way sliding unit configured to be connected to the holding unit and slide the holding unit to both sides of the body; and an elevation-driving unit configured to be installed at the body and connected to the two-way sliding unit to elevate the two-way sliding unit along a height direction of the body.

17 Claims, 11 Drawing Sheets

ROBOT FOR TRANSFERRING ARTICLE

CROSS REFERENCE TO RELATED APPLICATION

This application claims the benefit of Korean Patent Application No. 10-2015-0036084, filed on Mar. 16, 2015, entitled "ROBOT FOR TRANSFERRING ARTICLE", which is hereby incorporated by reference in its entirety into this application.

BACKGROUND OF THE INVENTION

1. Technical Field

The present invention relates to a robot moving along a moving rail and transferring an article.

2. Description of the Related Art

Generally, a semiconductor package is manufactured by producing a wafer in a semiconductor manufacturing process and inputting the produced wafer into the next production step.

In this case, the produced water is not input into just the next step but is stored for a predetermined time and then sequentially transferred to the next step as needed. Therefore, a facility for storing a waiting wafer is required. The storage facility is installed on the ground of the semiconductor factory, and therefore may take up a large space.

As a solution of the problem, a temporary storage facility for the wafer may be installed around a moving path of a robot transferring the wafer. However, the temporary storage facility may store only a small quantity of wafer for a while.

Therefore; a method for improving the temporary storage facility as an integrated facility for storing and. handling a large amount of wafers may be considered. In this case, an improved robot capable of efficiently transferring a wafer within the integrated facility is also required.

SUMMARY OF THE INVENTION

The present invention has been made in an effort to provide a robot tor transferring an article capable of efficiently transferring the article within an integrated storage space.

Further, the present invention has been made in an effort to provide a robot for transferring an article capable of being slid in both, directions while holding the article and elevating a means for sliding the article in both directions.

According to an exemplary embodiment of the present invention, there is provided a robot for transferring an article, including: a body configured to be moved while hanging on a moving rail; a holding unit configured to hold the article; a two-way sliding unit configured to be connected to the holding unit and slide the holding unit to both sides of the body; and an elevation-driving unit configured to be installed at the body and connected to the two-way sliding unit to elevate the two-way sliding unit along a height direction of the body.

The elevation-driving unit may include: an elevating block; a slide base configured to be supported to the elevating block and connected to the two-way sliding unit; and an elevation-moving member configured to move the elevating block along the height direction.

The body may include a pair of pillar parts disposed along the height direction and facing each other, and the elevation-moving member may be disposed in the pillar part, and the slide base may be disposed between the pair of pillar parts.

The pillar part may include a guide slot extended along the height direction and the elevating block connects the elevation-moving member and the slide base through the guide slot.

The elevation-driving unit may further include an elevation rail installed at the pillar part to be extended along the height direction and slidably supporting the elevating block.

The elevation-moving member may include: a pair of elevating pulleys configured to be disposed along the height direction; and an elevating belt configured to enclose the pair of elevating pulleys and be connected to the elevating block.

The elevating block may include: an insertion part configured to be inserted into the guide slot; a slide part configured to be bent at one end portion of the insertion part to be extended and supported to the elevation rail; and a connection part configured to be bent at the other end portion of the insertion part to be extended and connected to the elevating belt.

The slide part and the connection part may be bent in the same direction with respect to the insertion part.

The elevation rail may include a first elevation rail and a second elevation rail installed at the pillar part in parallel with each other, the elevating pulley may include a first elevating pulley corresponding to the first elevation rail and a second elevating pulley corresponding to the second elevation rail and the elevation-moving member may further include a driving device configured to be disposed between the first elevating pulley and the second elevating pulley to rotate the first elevating pulley and the second elevating pulley.

The driving device may include: a motor configured to generate a driving force; and a reducer configured to reduce the driving force of the motor and rotate the first elevating pulley and the second elevating pulley.

The two-way sliding unit may include: an upper plate configured to be movably coupled with the slide base; and a lower plate configured to be movably coupled with the upper plate and connected to the holding unit.

The two-way sliding unit may further include: a first sliding rail configured to be coupled with a bottom surface of the upper plate; and a first slider configured to be coupled to an upper surface of the lower plate and slidably coupled with the first sliding rail and the upper plate includes; both peripheral areas; and a central area protruding to be far away from, the lower plate than the both peripheral areas and mounted with the first sliding rail.

The two-way sliding unit may further include: a second sliding rail configured to be installed at the both peripheral areas of an upper surface of the upper plate; and a second slider configured to be installed at the slide base and slidably coupled to the second sliding rail.

The holding unit may include: a holding plate configured to be disposed at a lower portion of the lower plate and movably coupled to the lower plate, and the two-way sliding unit may further include: a driving module configured to generate a driving force for relative sliding among the upper plate, the lower plate, and the holding unit.

The driving module may include: a pair of first slide pulleys configured to be installed at the upper plate; a first slide belt configured to enclose the pair of first slide pulleys and connected to the slide base and the lower plate; and a slide moving member configured to move the first slide belt in any one of both directions according to an extending direction thereof.

The sliding moving member may include: a motor configured to generate a rotating force; a ball screw configured to be operated by receiving a rotating force of the motor; and a connection bracket configured to connect between a nut of the bail screw and the slide belt.

The driving module may include: a pair of second slide pulleys configured to be installed at the lower plate; and a second slide belt configured to enclose the pair of second slide pulleys and connected to the upper plate and the holding plate.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
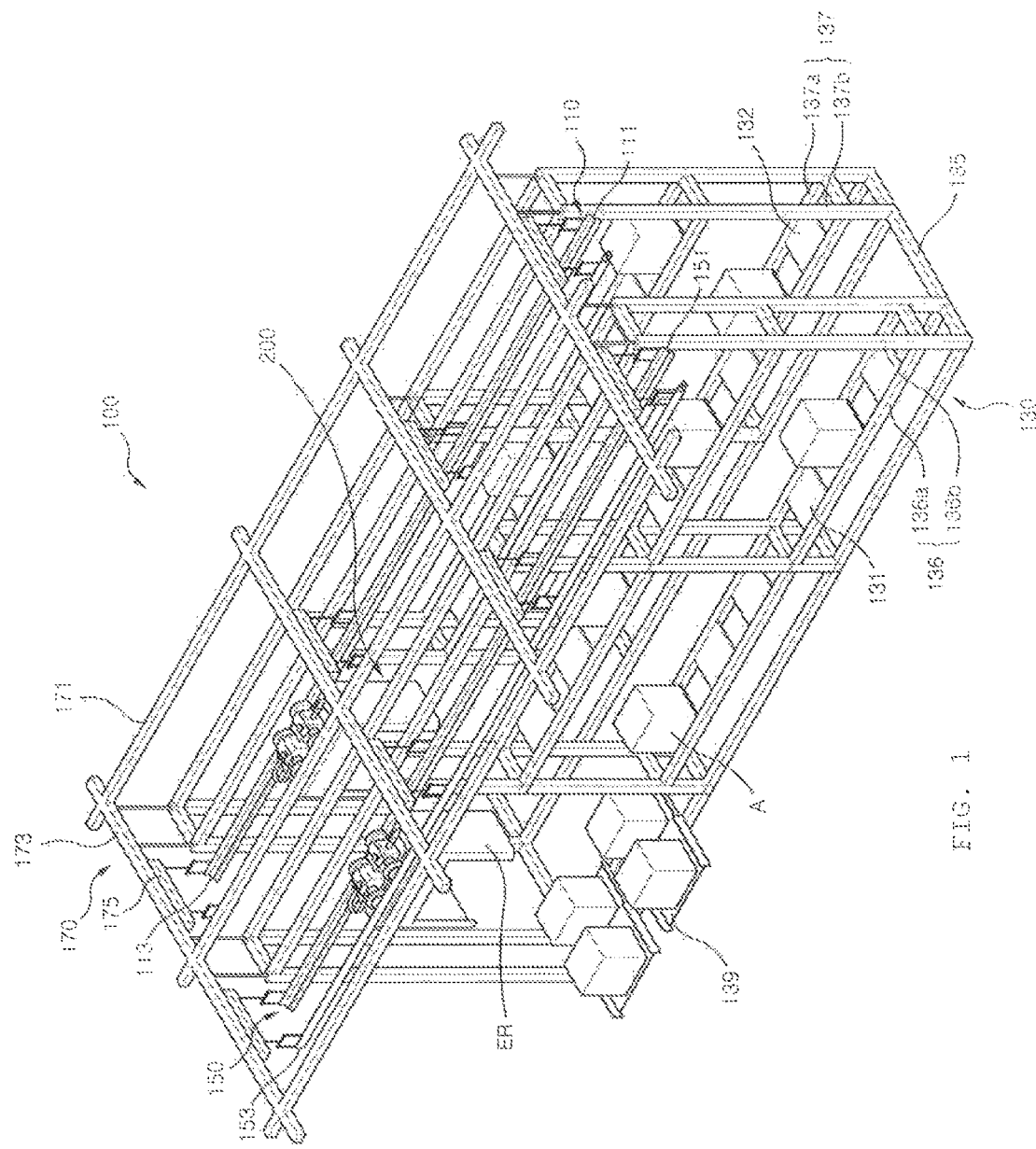
FIG. 1 is a perspective view of an apparatus 100 for storing and handling an article at a ceiling according to an exemplary embodiment of the present invention.

Hereinafter, a robot for transferring an article according to an exemplary embodiment of the present invention will be described with reference to the accompanying drawings. In the present specification, throughout the exemplary embodiments of the present invention, same or similar components will be denoted by the same or similar reference numerals and a description thereof will be replaced by a first description.

Figure 2:
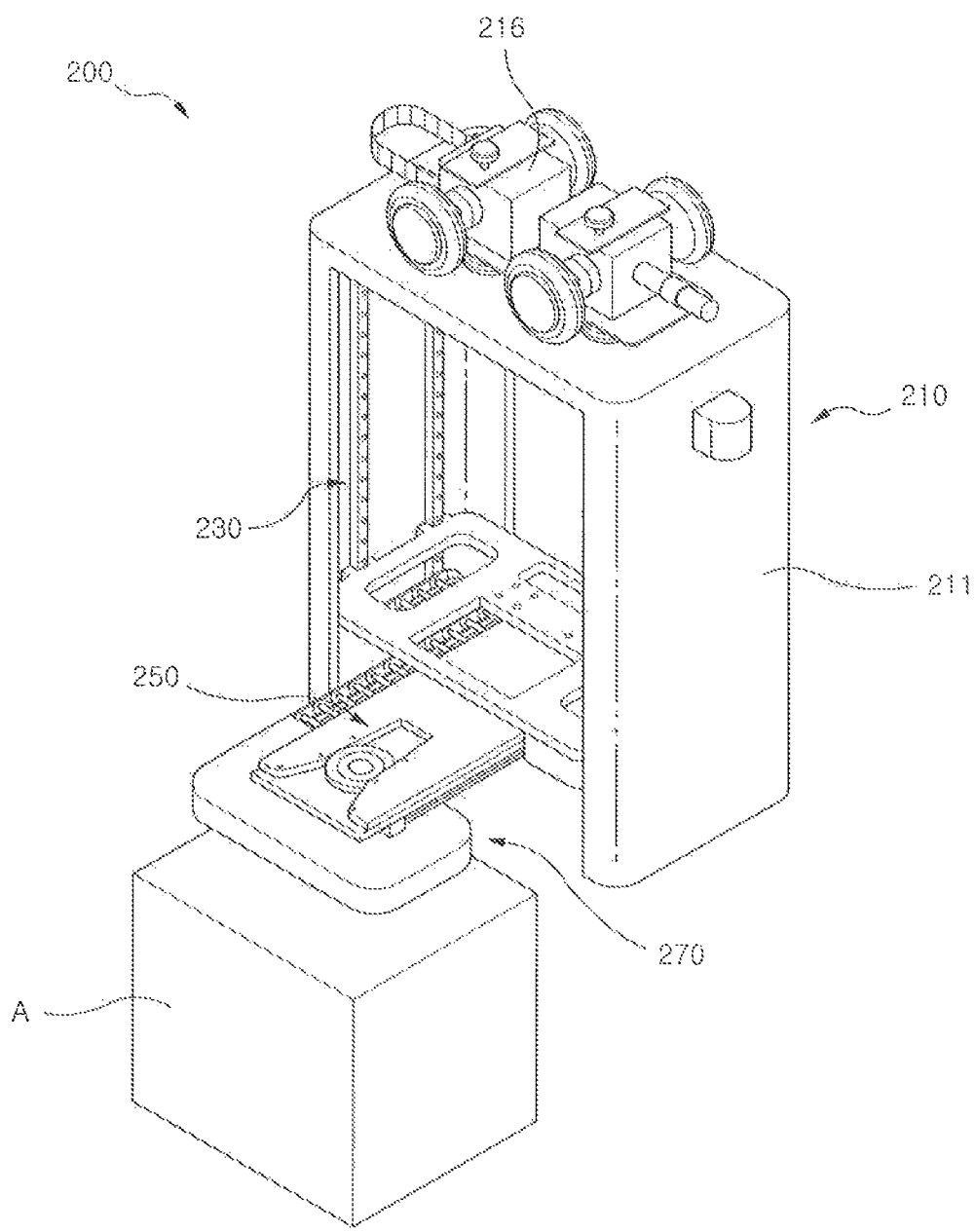
FIG. 2 is a side view of a main part of the apparatus 100 of FIG. 1.

FIG. 1 is a perspective view of an apparatus 100 for storing and handling an article at a ceiling according to an exemplary embodiment of the present invention and FIG. 2 is a side view of a main part of the apparatus 100 of FIG. 1.

Referring to FIGS. 1 and 2, the apparatus 100 for storing and handling an article at a ceiling may include an internal rail 110, a storage system 130, an external rail 150, a cradle 170, and an internal transfer robot 200.

The internal rail 110 is configured to drivably support the internal transfer robot 200. The internal rail 110 generally has a bar shape and forms a moving path (transfer path) of the internal transfer robot 200. Here, the internal rail 110 may be called a 'moving rail'.

The internal rail 110 may have a length corresponding to a shelf 131 of a first row and a shelf 132 of a second row that will be described below. For example, both end portions 111 and 113 of the internal rail 110 are extended to or beyond both end portions of the shelf 131 of the first row and the shelf 132 of the second row and may be called an exposed end portion. By this configuration, the exposed end portions 111 and 113 are not blocked by the shelf 131 of the first row and the shelf 132 of the second row along an extending direction of the internal rail 110.

Further, the internal rail 110 is configured to hang on the ceiling. According to the exemplary embodiment of the present invention, the internal rail 110 is connected to the cradle 170 to be described below to hang on the ceiling.

The storage system 130 is configured to store an article A, for example, a FOUP used in a semiconductor factory. The storage system 130 is configured to hang on the ceiling. The storage system 130 may include the shelf 131 of the first row, the shelf 132 of the second row, a lower frame 135, a first pillar frame 136, a second pillar frame 137, and a transport in/out port 139.

The shelf 131 of the first row and the shelf 132 of the second, row are shelves disposed at both sides of the internal rail 110 to face each other. The shelf 131 of the first row and the shelf 132 of the second row are spaced, apart from each other by an interval through which the internal transfer robot 200 may pass. The shelf 131 of the first row and the shelf 132 of the second row may each be configured as a plurality of individual shelves. Each shelf may have a size corresponding to one article A.

The lower frame 135 may form a bottom portion of the storage system 130. The lower frame 135 may generally have a quadrangular shape. The lower frame 135 may be formed long along the extending direction of the internal rail 110. The lower frame 135 is a medium, through which the shelf 131 of the first row and the shelf 132 of the second row are connected to each other.

The first pillar frame 136 and the second pillar frame 137 may be erected at both edges of the lower frame 135 while being spaced apart from each other. In this case, the first pillar frame 136 may be provided with the shelf 131 of the first row and the second pillar frame 137 may be provided with the shelf 132 of the second, row.

The first pillar frame 136 and the second, pillar frame 137 may have floor members 136a and 137a and wall members 136b and 137b.

The floor members 136a and 137a are configured to support the shelf 131 of the first row and the shelf 132 of the second row. The floor members 136a and 137a may be extended along the extending direction of the internal rail 110. The floor members 136a and 137a may be provided as a plurality of individual floors disposed to form a plurality of layers. The shelf 131 of the first row or the shelf 132 of the second row may also have the individual shelves forming a plurality of layers corresponding to the floor members 136a and 137a of the plurality of layers.

The wall members 136b and 137b are coupled to both end portions of the floor members 136a and 137a, respectively, and formed in pair, thereby firmly supporting the floor members 136a and 137a. The wall members 136b and 137b are disposed along a direction intersecting with a plane on which the floor members 136a and 137a are formed.

The transport in/out port 139 protrudes at a portion of the shelf 131 of the first row to be disposed at a lower portion of the external rail 150. An article A to be put on the shelf 131 of the first row or the shelf 132 of the second row or the article A taken out therefrom is temporarily put on the transport in/out port 139.

The external rail 150 is installed outside the storage system 130 and is disposed, to pass through an upper portion of the transport in/out port 139. The external rail 150 may generally be installed in parallel with the internal rail 110 in an area corresponding to the storage system 130. The external rail 150 may be movably provided with an external transfer robot ER that is operated in connection with the internal transfer robot 200. The external rail 150 may have exposed end portions 151 and 153 extended to or beyond the end portion of the shelf 131 of the first row or the shelf 132 of the second row along the extending direction of the external rail 150.

The cradle 170 is configured to hang on the ceiling. The cradle 170 may be connected to the internal rail 110, the storage system 130, and the external rail 150.

The cradle 170 may have a horizontal frame 171 and a vertical frame 173. The horizontal frame 171 and the vertical frame 173 may be disposed in a direction intersecting with each, other to form a lattice structure. Further, the cradle 170 may further include a medium frame 175 coupled with the vertical frame 173. The medium frame 175 is an object to which the internal rail 110 is connected and prevents vibrations due to the driving of the internal transfer robot 200 from being directly transferred to the storage system 130 through the vertical frame 173, etc.

By this configuration, the cradle 170 is connected to the ceiling by a connection rod (not illustrated), etc, in this state, the cradle 170 may be connected to the internal rail 110, the storage system 130, and the external rail 150. The internal rail 110 may be drivably provided with the internal transfer robot 200 and the external rail 150 may be drivably provided with the external transfer robot ER. The internal transfer robot 200 is moved between the first pillar frame 136 and the second pillar frame 137.

The article A is transferred by the external transfer robot ER and is put down to the transport in/out port 133. The internal transfer robot 200 picks up the article A and puts down the article A to any one of the shelf 131 of the first row or the shelf 132 of the second row. By this, the article A is stored in the storage system 130 and may suffer from purge handling.

On the contrary, the article A in the storage system 130 is carried on the internal transfer robot 200 to be moved toward the transport in/out port 139 and is then put down to the transport in/out port 139. In this process, the internal transfer robot 200 may be moved along the internal rail 110. The article A put on the transport in/out port 139 may be picked up by the external transfer robot ER to be transferred to other locations. By this, the article A deviates from the storage system 130.

The internal transfer robot 200 may perform work corresponding to the shelf 131 of the first row and the shelf 132 of the second row that face each other. In detail, the internal transfer robot 200 may put down the article A to both of the shelf 131 of the first row and the shelf 132 of the second row or pick up the article A from both of the shelf 131 of the first row and the shelf 132 of the second row.

By including the internal transfer robot 230, the storage system 130 may be formed in an integrated type in which the shelf 131 of the first row and the shelf 132 of the second row are each disposed at both sides of one internal rail 110.

Further, the shelf 131 of the first row and the shelf 132 of the second row may each be formed in the plurality of layers and therefore more articles A may be integrated and stored.

Further, the storage and handling system for an article A is formed by including the internal rail 110, the internal transfer robot 200 driving along the internal rail, and the transport in/out port 139. The system may be independently operated from the external transfer robot ER that is driven along the external rail 150.

The internal transfer robot 200 will be described with reference to FIGS. 3 and 4.

Figure 3:
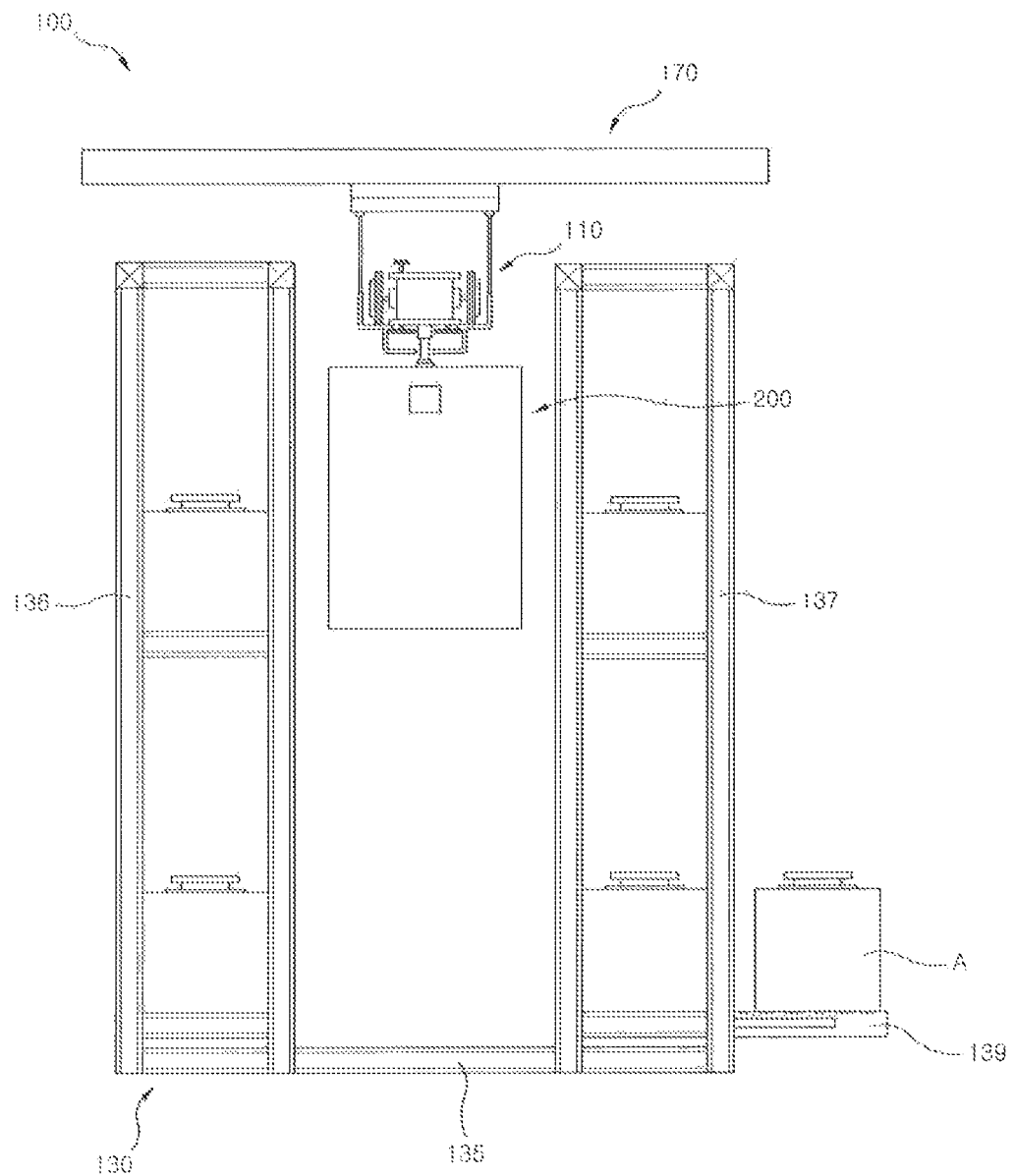
FIG. 3 is a perspective view of an internal transfer robot 200 of FIG. 1.
Figure 4:
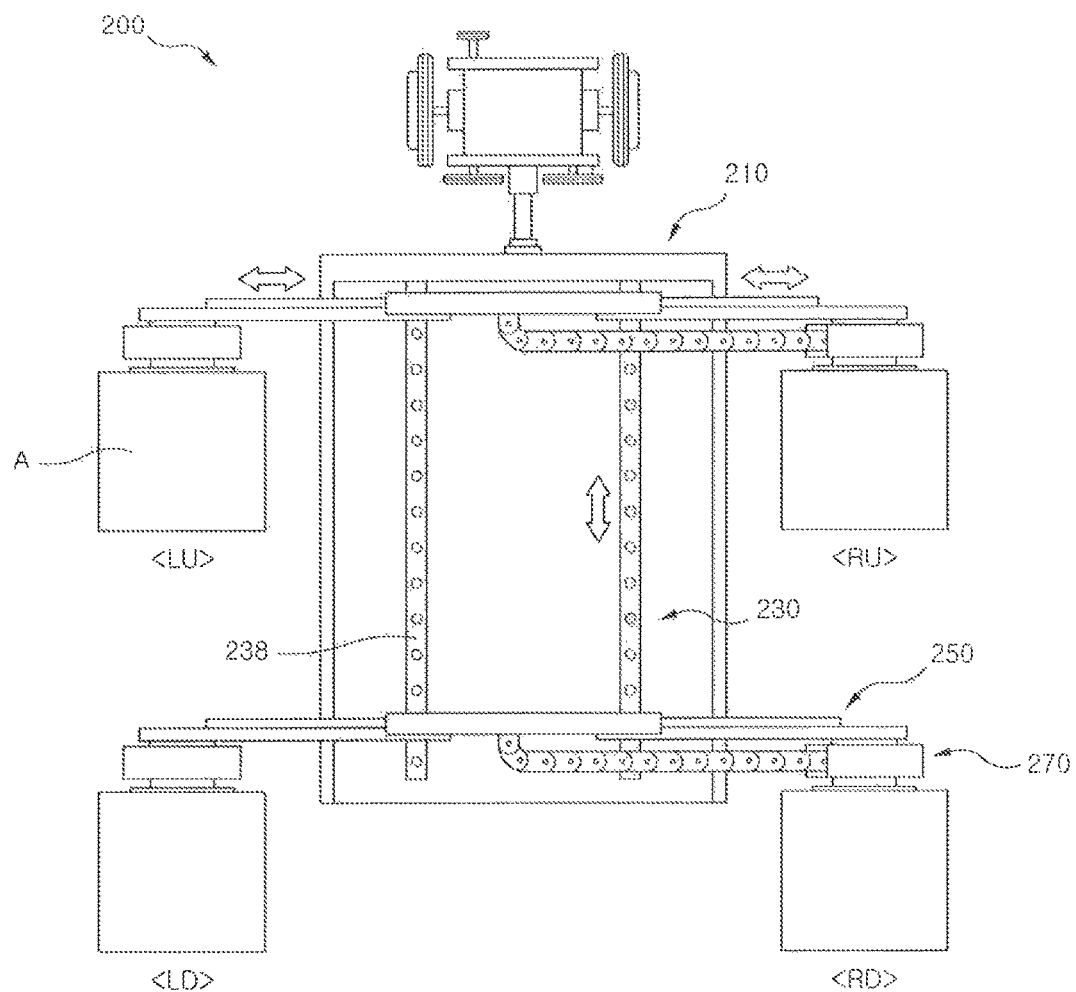
FIG. 4 is a conceptual diagram, for describing an operation of the internal transfer robot 200 of FIG. 3.

FIG. 3 is a perspective view of an internal transfer robot 200 of FIG. 1 and FIG. 4 is a conceptual diagram for describing an operation of the internal transfer robot 200 of FIG. 3.

Referring to FIGS. 3 and 4, the internal transfer robot 200 may include a body 210, an elevation-driving unit 230, a two-way sliding unit 250, and a holding unit 270.

The body 210 may have a base part 211 and a driver 216. The base part 211 is a part provided with the elevation-driving unit 230, etc. The driver 216 is a part that is installed at the base part 211 and hangs on the internal rail 110 (FIG. 1). The driver 216 has a wheel rolling on the internal rail 110.

The elevation-driving unit 230 is configured to elevate the two-way sliding unit 250 along the height direction of the base part 211, or the shelf 131 of the first row and the shelf 132 of the second row (see FIG. 1). For this purpose, the elevation-driving unit 230 may include a motor and a belt linked to the rotation of the motor. The two-way sliding unit 250 may be connected to the belt and elevated while being supported to the sliding rail 238.

The two-way sliding unit 250 is configured to be installed at the elevation-driving unit 230 and slid in both directions based on the base part 211. For the sliding operation of the two-way sliding unit 250, the two-way sliding unit 250 may be configured of a plurality of plates. In this case, the slid direction of the plurality of plates may be toward any one of the shelf 131 of the first row and the shelf 132 of the second row.

The holding unit 270 is configured to be connected to a free end of the two-way sliding unit 250 and hold the article A.

By this configuration, the driver 216 of the body 210 is driven along the internal rail 110 while being supported to the internal rail 110. By this, the base part 211 may be moved from one end of the storage system 130 (FIG. 1) to the other end along the internal rail 110.

When the base part 211 arrives at a set position for any one of the shelf 131 of the first row and the shelf 132 of the second row, the two-way sliding unit 250 slides the holding unit 270 toward the set article A.

In this case, when the article A is positioned to be higher or lower than the holding unit 270, the height of the two-way sliding unit 250 may be changed by the operation of the elevation driving unit 230.

When the two-way sliding unit 250 is positioned at a height corresponding to the article A, the holding unit 270 is put on the article A while the two-way sliding unit 250 is slid. Next, the holding unit 270 may be operated to hold the article A.

As a result, the holding unit 270 may hold or put down the article A at four locations such as a left upper (LU) position, a left lower (LD) position, a right upper (RU) position, and a right lower (RD) position.

On the contrary, when the article A put on the shelf 131 of the first row or the shelf 132 of the second row is taken out to the outside of the storage system 130, the internal transfer robot 200 is operated to the contrary to one described above.

Next, the purge of the article A put on the shelf 131 of the first row and the shelf 132 of the second row will be described with reference to FIG. 5.

Figure 5:
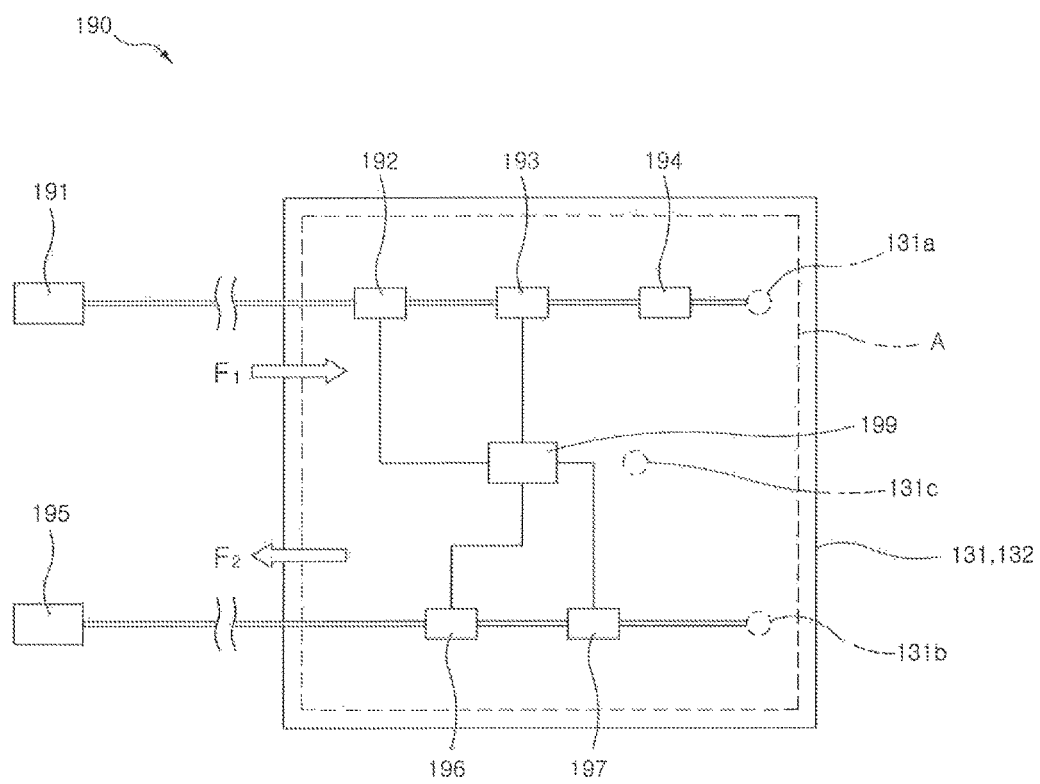
FIG. 5 is a block diagram for describing a purge unit 190 for purging an article A put on the shelves 131 and 132 of FIG. 1.

FIG. 5 is a block diagram for describing a purge unit 130 for purging an article A put on the shelves 131 and 132 of FIG. 1.

First, a supply nozzle 131a, an exhaust nozzle 131b, and a carrier sensing sensor 131c may be installed at the shelves 131 and 132 (hereinafter, only 131 is described). The supply nozzle 131a and the exhaust nozzle 131b are installed at an upper surface of the shelf 131 and communicate with an inside of the article A. A carrier sensing sensor 131c is installed at the upper surface of the shelf 131 to figure out whether the article A is positioned at the shelf 131.

For the purge of the article A, the purge unit 190 may be further provided. The purge unit 190 may have a gas tank 191, a recovering pump 195, and a controller 199.

The gas tank 131 communicates with the article A to provide purge gas into the article A. In more detail, the purge gas may pass through a supply valve 192, a supply flowmeter 193, and a gas filter 134 while flowing from the gas tank 191 to the supply nozzle 131a.

The supply valve 192 is configured to open and close a channel for the supply flow of purge gas. The supply valve 132 is an electrical valve and configured to perform the opening and closing operation depending on the electrical signal. The supply flowmeter 133 is disposed between the supply valve 192 and the supply nozzle 131a to adjust a flux of gas toward the supply nozzle 131a as set. The gas filter 194 is installed between the supply flowmeter 193 and the supply nozzle 131a to filter foreign matters in the gas supplied into the article A through the supply nozzle 131a. Here, the supply valve 192 and the supply flowmeter 193 may be integrated in a digital mass flow controller. In this case, the digital mass flow controller may set a supply amount of gas over time and may be electronically controlled by a computer.

The recovering pump 195 communicates with the article A to forcibly recovery the purge gas supplied to the article A. In detail, the purge gas may pass through an exhaust valve 196 and an exhaust flowmeter 197 while flowing from the recovering nozzle 131b to the recovering pump 195.

The recovering valve 196 is configured to open and close a channel for the exhaust flow of purge gas. The recovering valve 196 is an electrical valve and configured to perform the opening and closing operation depending on the electrical signal. The recovering flowmeter 197 is disposed between the recovering valve 196 and the recovering nozzle 131b to adjust the flux of gas recovered to the outside of the article A through the recovering nozzle 131b as set.

The controller 199 controls the opening and closing of the gas tank 191 and the operation of the recovering pump 195. The controller 199 may receive various information from the supply flowmeter 193, the recovering flowmeter 197, and the carrier sensing sensor 131c to control the operation of the supply valve 192 and the recovering valve 196.

For example, the controller 199 may control the opening and closing of the supply valve 192 and the recovering valve 196 based on the difference between the supplied flux measured by the supply flowmeter 193 and the recovered flux measured by the recovering flowmeter 197. In detail, when the recovered flux is subtracted from the supplied flux, the amount of gas charged in the article A is calculated. If the charged amount of gas is under the criterion, the recovering valve 196 may be closed while the supply valve 132 is in an open state. On the contrary, if the charged amount of gas exceeds the criterion, the recovering valve 196 may be open while the supply valve 192 is in a closed state.

As described above, the opening of the recovering valve 196 and the operation of the recovering pump 196 by the controller 199 are performed after the set time lapses after the supply valve 192 is open. This enables the active recovering for the purge gas. By doing so, oxidation of a wafer due to the purge gas continuously remaining within the article A or air pollution of a workspace due to a leakage of purge gas may be reduced while the article A is purged by the purge gas.

Further, the controller 199 may control the opening and closing of the supply valve 192 and/or the recovering valve 196 based on the sensing result of the carrier sensing sensor 131c. In detail, when the carrier sensing sensor 131c senses that the article A is present on the shelf 131, the supply valve 192 may be open. The controller 199 may control the recovering valve 196 to be open it a predetermined amount of gas is charged within the article A after a predetermined time lapses after the opening of the supply valve 192 is controlled.

Hereinafter, the internal transfer robot 200 [robot for transferring an article] described above will be described in more detail with reference to FIGS. 6 to 12.

Figure 6:
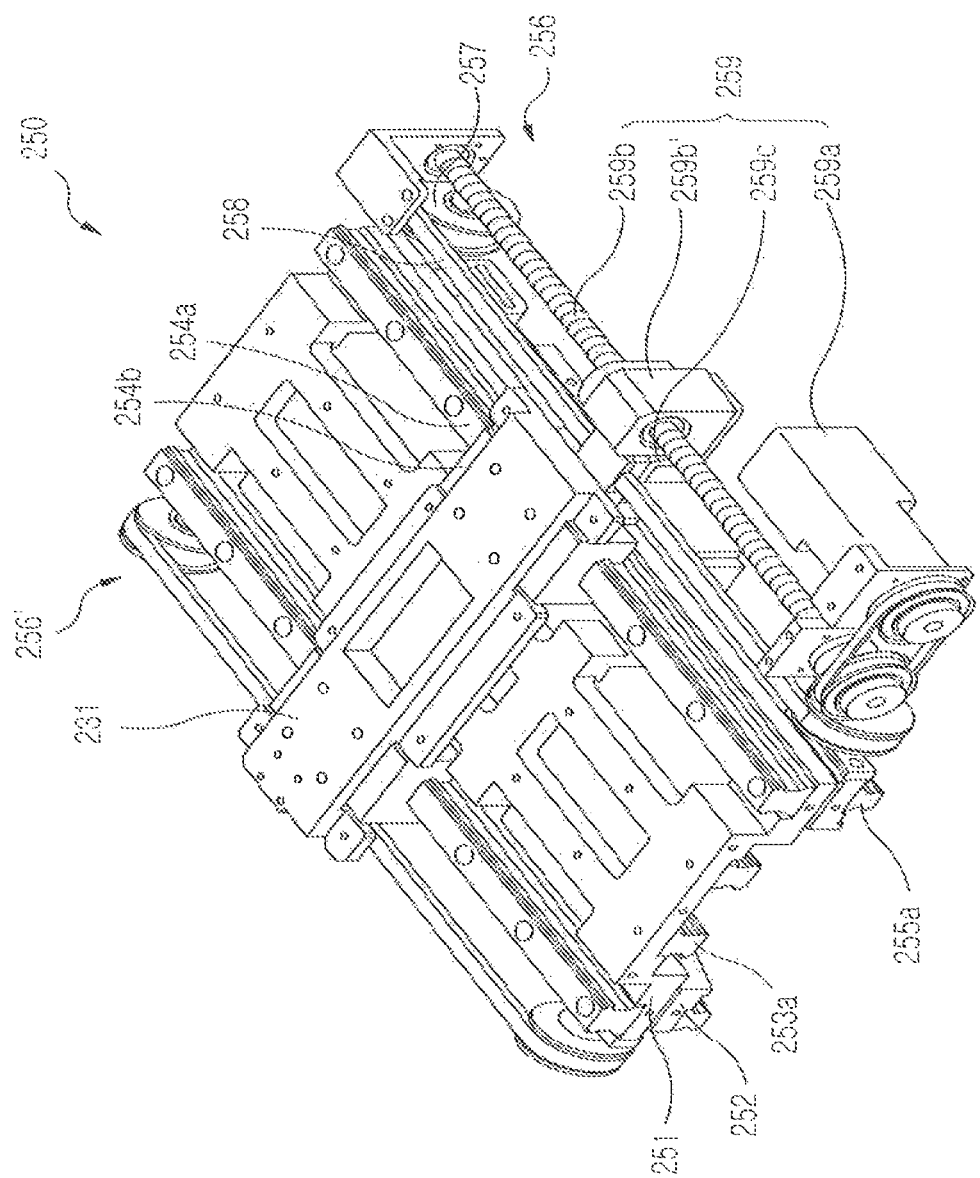
FIG. 6 is a perspective view illustrating main components of a two-way sliding unit 200 according to an exemplary embodiment of the present invention.
Figure 7:
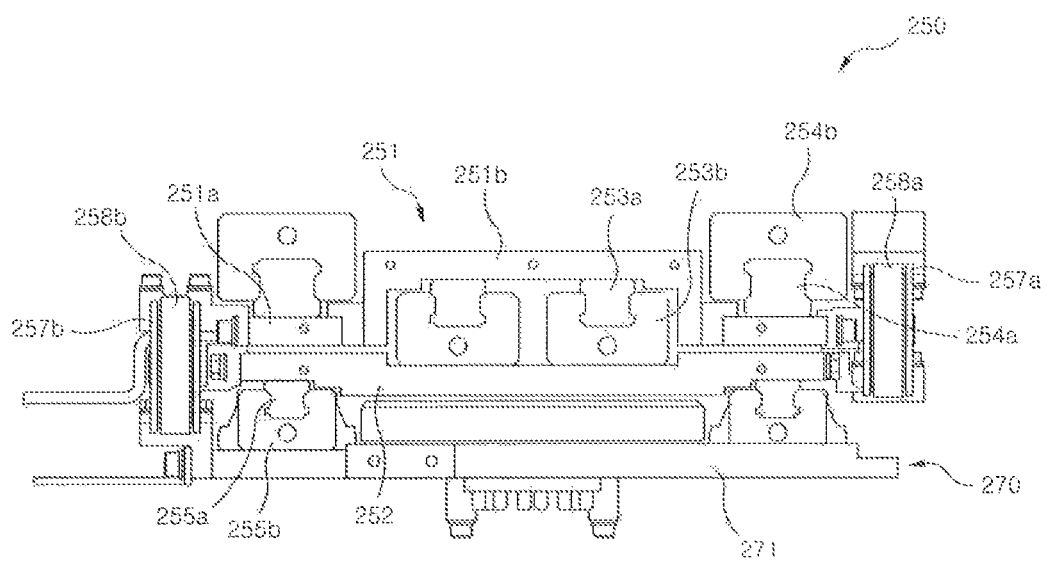
FIG. 7 is a transversal cross-sectional view of a two-way sliding unit 250 of FIG. 6.

FIG. 6 is a perspective view illustrating main components of a two-way sliding unit 250 according to an exemplary embodiment of the present invention and FIG. 7 is a transversal cross-sectional view of the two-way sliding unit 250 of FIG. 6.

As described above, the robot for transferring an article 200 may include the body 210, the elevation-driving unit 230, the two-way sliding unit 250, and the holding unit 270.

Among them, the two-way sliding unit 250 connects between the elevation-driving unit 230 and the holding unit 270 to slide the holding unit 270 to both sides of the body In detail, the two-way sliding unit 250 may include an upper plate 251, a lower plate 252, a first sliding rail 253a/first slider 253b, a second sliding rail 254a / second slider 254b, a third sliding rail 255a/third slider 255b, and a driving module 256.

The upper plate 251 is connected to a slide base 231 of the elevation-driving unit 230 and is coupled to the body 210 via the slide base 231. Here, the upper plate 251 may be slidably coupled to the slide base 231.

The upper plate 251 may include peripheral areas 251a and a central area 251b. The peripheral areas 251a are positioned at both sides of the central area 251b. Compared to the peripheral areas 251a, the central area 251b may protrude to be far away from the lower plate 252.

The lower plate 252 may be movably coupled to the upper plate 251 and coupled to the holding unit 270. The lower plate 252 may substantially be parallel with the upper plate 251. By this configuration, when the upper plate 251 is disposed at a lower portion of the slide base 231, the lower plate 252 may be disposed at the lower portion of the upper plate 251. Further, the lower plate 252 may be positioned at the upper portion of the holding plate 271 of the holding unit 270 and may be slidably coupled to the holding plate 271.

The first sliding rail 253a may be coupled to a bottom surface of the upper plate 251. The first sliding rail 253a may be arranged along substantially a vertical direction to the elevating direction of the elevation-driving unit 230. Corresponding to the first sliding rail 253a, the first slider 253b is coupled to the upper surface of the lower plate 252. The first slider 2530 is slidably coupled to the first sliding rail 253*a*. These first sliding rail 253*a* and first slider 253*b* may each be disposed within the central area 251*b* of the upper plate 251.

The second sliding rail 254*a* may be coupled to the both peripheral areas 251*a* of the upper surface of the upper plate 251. In response, the second slider 254*b* may be coupled to the body 210, in detail, the bottom surface of the slide base 231. The second sliding rail 254*a* is slidably coupled to the second slider 254*b*.

The third sliding rail 255*a* may be coupled to the bottom surface of the lower plate 252, In response, the third slider 255*b* may be coupled to the upper surface of the holding plate 271. The third sliding rail 255*a* is slidably coupled to the third slider 255*b*.

The driving module 256 generates a driving force for relative sliding between the upper and lower plates 251 and 252 and the holding unit 270. The driving module 256 may include in detail a slide pulley 257, a slide belt 258, and a slide moving member 259.

The slide pulley 257, in detail, the first slide pulley 257*a* is installed at a front end and a rear end of the upper plate 251, respectively, based on the right driving module 256 (see FIG. 6) and may be provided in The slide belt 258, in detail, the first slide belt 258*a* encloses the pair of first slide pulleys 257*a*. The first slide belt 258*a* is connected to the slide base 231 and the lower plate 252.

The slide moving member 259 moves the first slide belt 258*a* in any one of both directions depending on the extending direction thereof. The slide moving member 259 may include a motor 259*a*, a ball screw 259*b*, and a connection bracket 259*c*. A rotating force of the motor 259*a* may be transferred to a ball screw 259*b* using a pulley and a belt. A nut 259*b*' of the ball screw 259*b* is connected to the slide belt 258 by the connection bracket 259*c*.

Unlike this, in a left driving module 256' (see FIG. 6), the slide pulley 257, in detail, the second slide pulley 257*b* is installed at the lower plate 252. Further, the slide belt 258, in detail, the second slide belt 258*b* may be connected to the upper plate 251 and the holding plate 271, respectively.

By the configuration, the upper plate 251 may be relatively slid to the slide base 231, the lower plate 252 may be relatively slid to the upper plate 251, and the holding plate 271 may be relatively slid to the lower plate 252. By doing so, the sliding operation may be made based on the slide base 231 in a multi stage. The sliding operation to both sides of the slide base 231 may be made.

Further, due to the difference in the connection relationship of the slide pulley 257 and the slide belt 258 between the right driving module 256 and the left driving module 256', the sliding operation may be larger than an operation speed of the sliding moving member 259.

Structurally, the second sliding rail 254*a* and the second slider 254*b* and the third sliding rail 255*a* and the third slider 255*b* deviate from the central area 251*b* at the upper/lower portions based on the first sliding rail 253*a* and the first slider 253*b* that are positioned within the central area 251*b* of the upper plate 251 and thus may have a zigzag arrangement on the whole. By this, it is possible to secure the structural stability while minimizing the height of the two-way sliding unit 250.

A basic operation of the two-way sliding unit 250 will be additionally described with reference to FIGS. 8 to 10.

Figure 8:
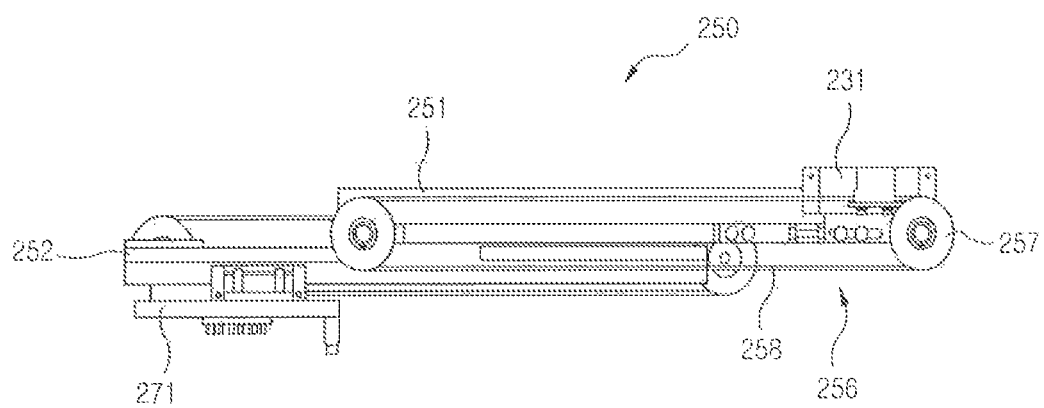
FIG. 8 is a perspective view illustrating a state in which the two-way sliding unit 250 of FIG. 6 is slid in one direction.
Figure 9:
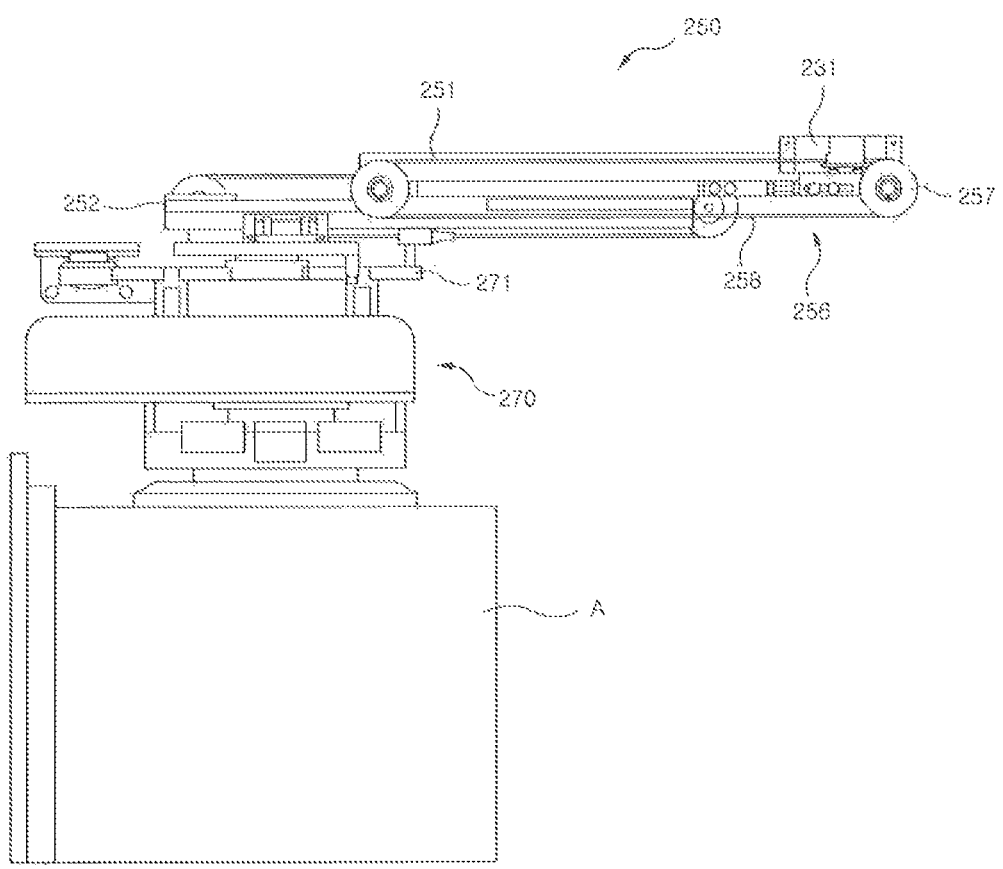
FIG. 9 is a conceptual diagram illustrating a state in which the two-way sliding unit 250 of FIG. 7 is slid to the left in the drawing while holding an article A.
Figure 10:
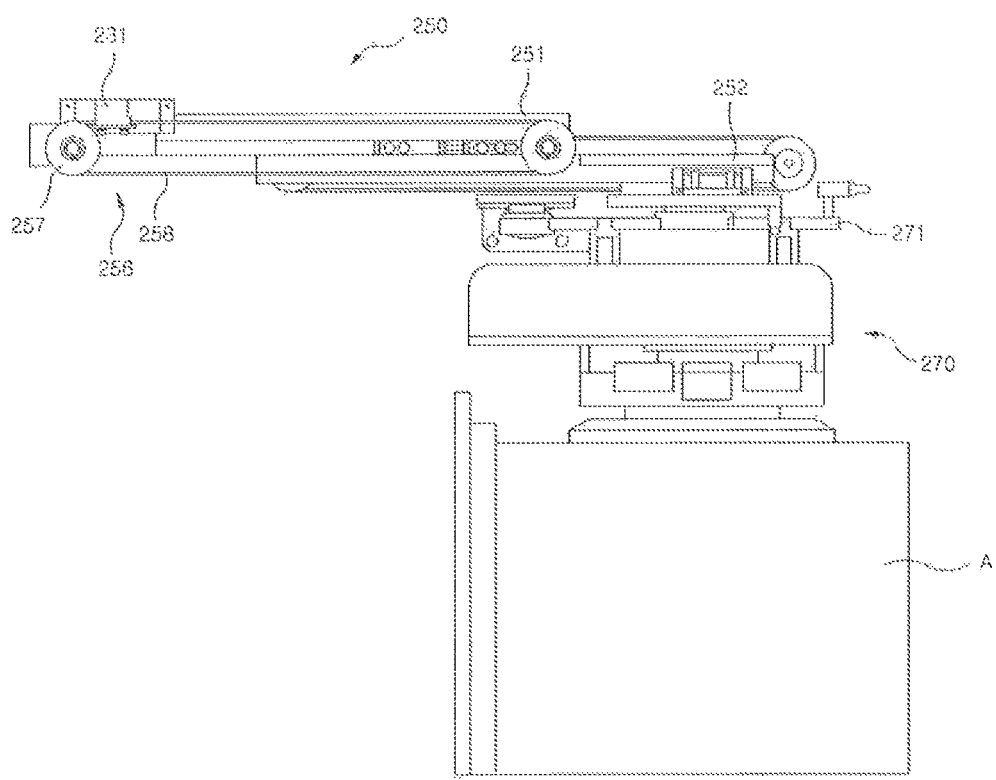
FIG. 10 is a conceptual diagram illustrating a state in which the two-way sliding unit 250 of FIG. 7 is slid to the right in the drawing while holding the article A.

FIG. 8 is a perspective view illustrating a state in which the two-way sliding unit 250 of FIG. 6 is slid in one direction, FIG. 9 is a conceptual diagram. illustrating a state in which the two-way sliding unit 250 of FIG. is slid to the left in the drawing while holding an article A, and FIG. 10 is a conceptual diagram illustrating a state in which the two-way sliding unit 250 of FIG. 7 is slid to the right in the drawing while holding the article A.

Referring to FIG. 8, the two-way sliding unit 250 is slid to the left in the drawing. By this, the holding plate 271 is maximally slid to the left based on the slide base 231 in the drawing.

In detail, the slide base 231 is positioned at the left end portion of the upper plate 251 by the driving module 256 of the front side in the drawing. The lower plate 252 is moved to the position deviating from the left end portion of the upper plate 251 along the extending direction of the upper plate 251.

Further, the holding plate 271 is positioned at the left end portion of the lower plate 252 by the driving module 256 of the rear side in the drawing.

Referring to FIG. 9, it may be confirmed that the article A is maximally slid to the left based on the slide base 231 by the sliding operation of the two-way sliding unit 250 as described above.

Referring to FIG. 10, it may be confirmed that the two-way sliding unit 250 is operated to be slid in an opposite direction one described above and thus the article A is maximally slid to the right based on the slide base 231 in the drawing.

Next, the elevation-driving unit 230 will be described with reference to FIGS. 11 and 12.

Figure 11:
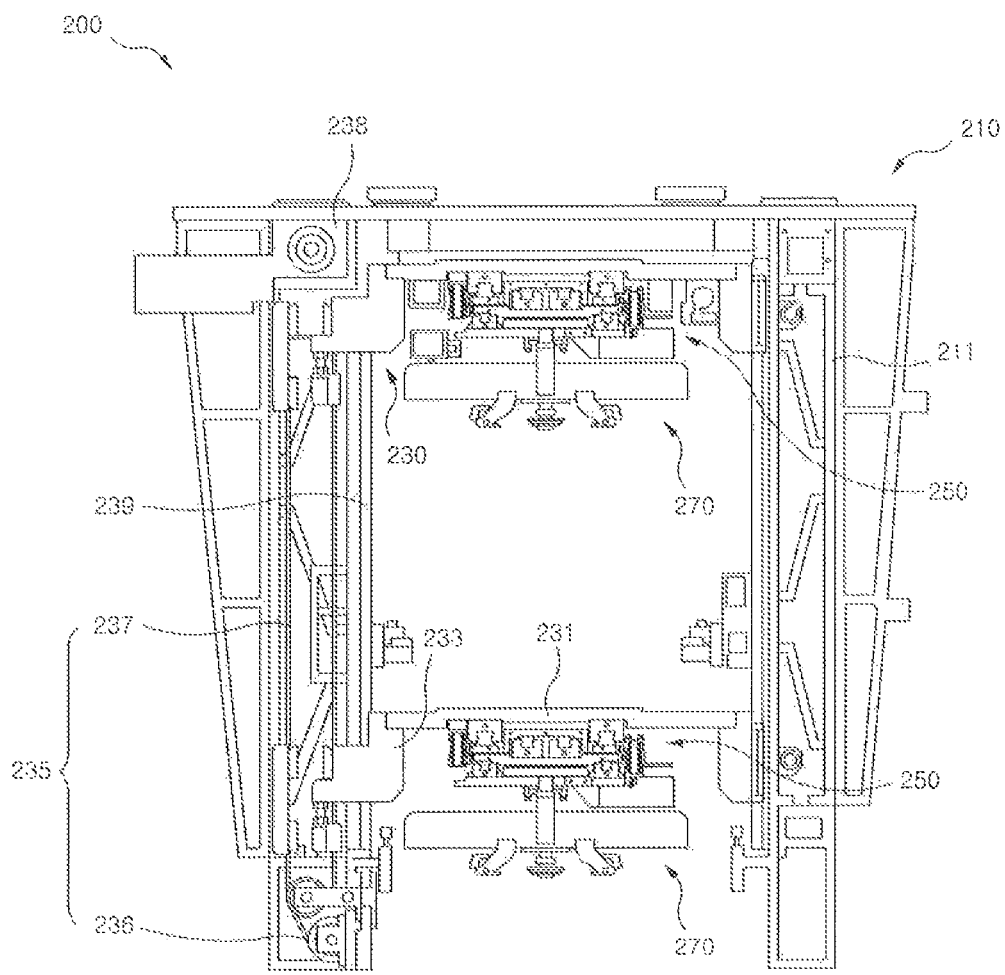
FIG. 11 is a conceptual diagram illustrating a state in which an elevation-driving unit 230 and the two-way sliding unit 250 of FIG. 2 are each positioned at an upper portion and a lower portion of a body 110.
Figure 12:
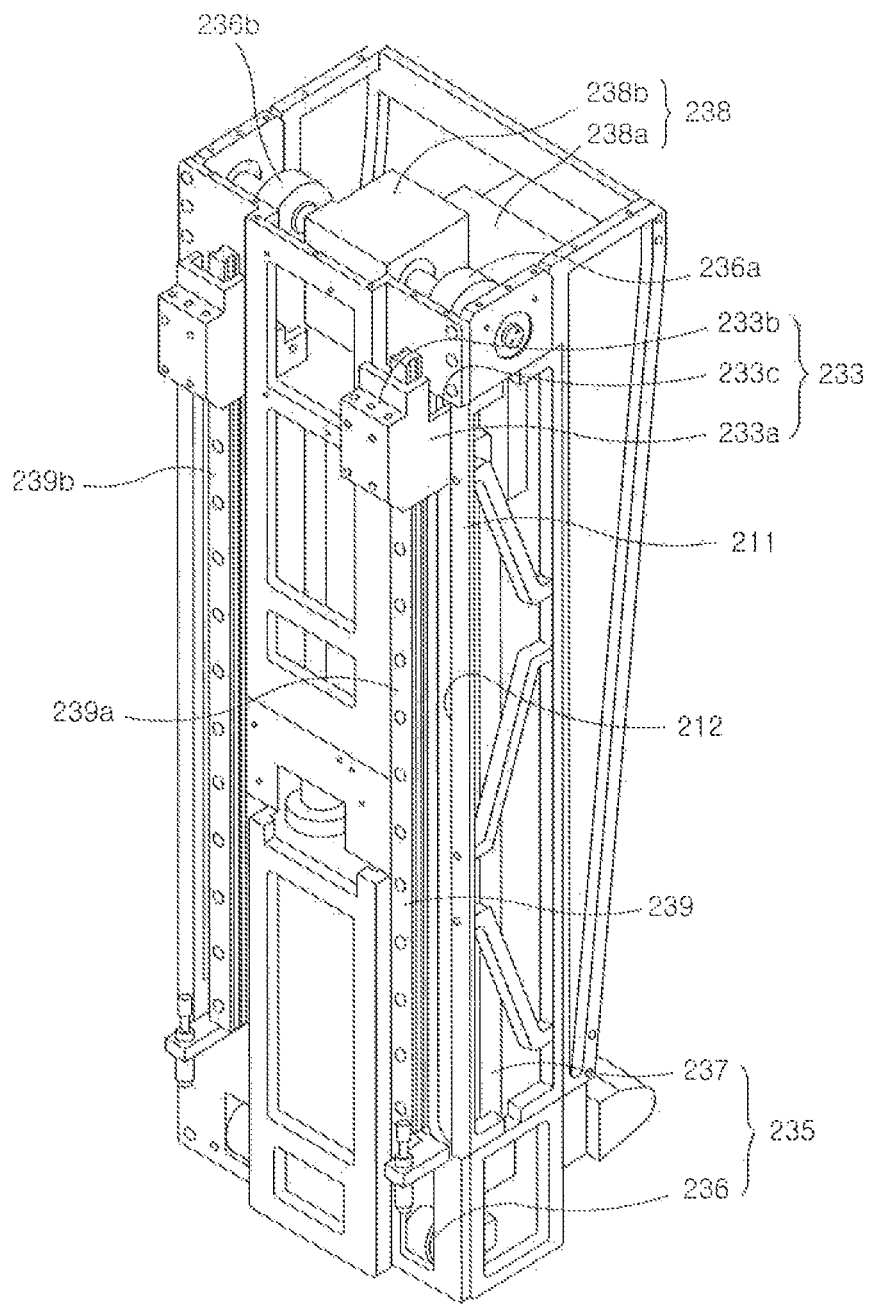
FIG. 12 is a perspective view for describing a configuration of the elevation-driving unit 230 of FIG. 11.

FIG. 11 is a conceptual diagram illustrating a state in which an elevation-driving unit 230 and the two-way sliding unit 250 of FIG. 2 are each positioned at an upper portion and a lower portion of a body 110 and FIG. 12 is a perspective view for describing a configuration of the elevation-driving unit 230 of FIG. 11.

Referring to FIG. 11, the elevation-driving unit 230 may be connected to the body 510, in detail, a pair of pillar parts 211.

The elevation-driving unit 230 may include the slide base 231, the elevating block 233, an elevation-moving member 235, and an elevation rail 239.

The slide base 231 is connected to the upper plate 251 (FIG. 6) of the two-way sliding unit 250. The slide base 231 is positioned between the pair of pillar parts 211.

The elevating block 233 is installed at the pair of pillar parts 211, respectively to support the slide base 231 and is elevated along the elevating direction. Here, the elevating direction may be the height direction of the body 210, in detail, the pillar part 211. Further, two elevating blocks 233 for one pillar part 211 may be adopted.

The elevation-moving member 235 moves the elevating block 233 along the elevating direction. The elevation-moving member 235 may be installed in the pillar part 211. The elevation-moving member 235 may include, in detail, a pair of elevating pulleys 236, an elevating belt 237, and a driving device 238.

The pair of elevating pulleys 236 are each disposed at an upper end and a lower end of the pillar part 211. The elevating pulley 236 may be rotated by the driving device 238. The pair of elevating pulleys 236 may have a first elevating pulley 236*a* and a second elevating pulley 236*b* corresponding to the two elevating blocks 233.

The elevating belt 237 encloses the pair of elevating pulleys 236. In detail, the elevating belt 237 is also provided in two. Here, each of the elevating belts 237 encloses the first elevating pulley 236*a* and the second elevating pulley 236*b*.

The driving device 238 is disposed between a first elevating pulley 236a and a second elevating pulley 236b to rotate both of the first elevating pulley 236a and the second elevating pulley 236b, The driving device 238 may have a motor 238a and a reducer 238b. The motor 238a is provided in one and the reducer 23 8b is also provided in one. The reducer 238b reduces the driving force transferred to the motor 238a to rotate the first elevating pulley 236a and the second elevating pulley 236b.

The elevation rail 239 is installed at the pillar part 211 along the elevating direction to slidably support the elevating block 233. The elevation rail 239 may be divided into a first elevation rail 231a and a second elevation rail 239b corresponding to the two elevating blocks 233.

Referring to FIG. 12, a guide slot 212 may be formed at the pillar part 211. The guide slot 212 may be provided, in two corresponding to the first elevation rail 239a and the second elevation rail 239b. The guide slot 212 guides the movement according to the elevating direction of the elevating block 233.

The elevating block 233 may include an insertion part 233a, a slide part 233b, and a connection part 233c, The insertion part 233a is inserted into the guide slot 212, The slide part 233b is bent at one end of the insertion part 233a to be slidably coupled to the elevation rail 238. The connection part 233c is bent at the other end of the insertion part 233a to be connected to the elevating belt 237.

By the structure, the slide part 233b and the connection part 233c and the elevation rail 238 and the elevating belt 237 coupled to each of the slide part 233b and the connection part 233c are eccentrically disposed at one side of the guide slot 212. In other words, the slide part 233b and the connection part 233c are bent in the same direction based on the insertion part 233a.

Further, the pair of elevation-moving members 235 may be disposed at one pillar part 211. In this case, the slide parts 233b of the pair of elevating blocks 233 corresponding to each elevation-moving member 235 may be disposed to face each other. By this, the pair of elevation rails 238 is disposed between the pair of guide slots 212. The slide base 231 and the two-way sliding unit 250 may be firmly supported by the pair of elevating blocks 233.

According to the exemplary embodiment of the present, invention configured as described, above, the robot for transferring an article may slide the article in both directions and elevate the means for sliding the article in both directions.

As a result, it is possible to hold to articles at the shelves of each layer or pus the articles down on the shelves of each layer, corresponding to the shelves of the plural layers.

By doing so, the robot for transferring an article may effectively transfer the article within the integrated storage space.

The robot for transferring an article as described above is not limited to the configuration and the operation method of the exemplary embodiments as described above. The above-mentioned exemplary embodiments may also be variously modified through a selective combination of all or some thereof.

What is claimed is:

1. A robot for transferring a semiconductor component pod, comprising:
   a body including a rail driver configured to be hung and drive the body on a moving rail that solely supports the body, the body having a pair of pillar parts connected to the rail driver and disposed along a height direction of the body, and the pillar parts face each other;
   a holding unit configured to hold a top end of the semiconductor component pod from above;
   a two-way sliding unit configured to be connected to the holding unit and slide the holding unit past both sides of the body; and
   an elevation-driving unit configured to be installed at the pillar parts and connected to the two-way sliding unit to elevate the two-way sliding unit along the height direction,
   wherein the elevation-driving unit includes an elevation rail being installed at the pillar parts to be extended along the height direction and guiding an elevating motion of the two-way sliding unit along the height direction.

2. The robot of claim 1, wherein the elevation-driving unit includes:
   an elevating block;
   a slide base configured to be supported to the elevating block and connected to the two-way sliding unit; and
   an elevation-moving member configured to move the elevating block along the height direction.

3. The robot of claim 2, wherein
   the elevation-moving member is disposed in the pillar parts and the slide base is disposed between the pillar parts.

4. The robot of claim 3, wherein the pillar part includes a guide slot extended along the height direction, and
   the elevating block connects the elevation-moving member and the slide base through the guide slot.

5. The robot of claim 4, wherein the elevation rail slidably supports the elevating block.

6. The robot of claim 5, wherein the elevation-moving member includes:
   a pair of elevating pulleys configured to be disposed along the height direction; and
   an elevating belt configured to enclose the pair of elevating pulleys and be connected to the elevating block.

7. The robot of claim 6, wherein the elevating block includes;
   an insertion part configured to be inserted into the guide slot;
   a slide part configured to be bent at one end portion of the insertion part to be extended and supported to the elevation rail; and
   a connection part configured to be bent at the other end portion of the insertion part to be extended and connected to the elevating belt.

8. The robot of claim 7, wherein the slide part and the connection part are bent in the same direction with respect to the insertion part.

9. The robot of claim 6, wherein the elevation rail includes a first elevation rail and a second elevation rail installed at the pillar part in parallel with each other,
   the elevating pulley includes a first elevating pulley corresponding to the first elevation rail and a second elevating pulley corresponding to the second elevation rail, and
   the elevation-moving member further includes a driving device configured to be disposed between the first elevating pulley and the second elevating pulley to rotate the first elevating pulley and the second elevating pulley.

10. The robot of claim 9, wherein the driving device includes;
    a motor configured to generate a driving force; and a reducer configured to reduce the driving force of the motor and rotate the first elevating pulley and the second elevating pulley.

11. The robot of claim 2, wherein the two-way sliding unit includes:
an upper plate configured to be movably coupled with the slide base; and
a lower plate configured to be movably coupled with the upper plate and connected to the holding unit.

12. The robot of claim 11, wherein the two-way sliding unit further includes:
a first sliding rail configured to be coupled with a bottom surface of the upper plate; and
a first slider configured to be coupled to an upper surface of the lower plate and slidably coupled with the first sliding rail, and
the upper plate includes:
peripheral areas; and
a central area protruding to be farther away from the lower plate than the peripheral areas and mounted with the first sliding rail.

13. The robot of claim 12, wherein the two-way sliding unit further includes:
a second sliding rail configured to be installed at the peripheral areas of an upper surface of the upper plate; and
a second slider configured to be installed at the slide base and slidably coupled to the second sliding rail.

14. The robot of claim 11, wherein the holding unit includes:
a holding plate configured to be disposed at a lower portion of the lower plate and movably coupled to the lower plate, and
the two-way sliding unit further includes:
a driving module configured to generate a driving force for relative sliding among the upper plate, the lower plate, and the holding unit.

15. The robot of claim 14, wherein the driving module includes:
a pair of first slide pulleys configured to be installed at the upper plate;
a first slide belt configured to enclose the pair of first slide pulleys and connected to the slide base and the lower plate; and
a slide moving member configured to move the first slide belt in opposite directions according to an extending direction thereof.

16. The robot of claim 15, wherein the sliding moving member includes:
a motor configured to generate a rotating force;
a ball screw configured to be operated by receiving a rotating force of the motor; and
a connection bracket configured to connect between a nut of the ball screw and the slide belt.

17. The robot of claim 14, wherein the driving module includes:
a pair of second slide pulleys configured to be installed at the lower plate; and
a second slide belt configured to enclose the pair of second slide pulleys and connected to the upper plate and the holding plate.

* * * * *